US011817151B2

(12) United States Patent
Varisco et al.

(10) Patent No.: US 11,817,151 B2
(45) Date of Patent: Nov. 14, 2023

(54) TRACKING OPERATIONS PERFORMED AT A MEMORY DEVICE

(71) Applicant: MICRON TECHNOLOGY, INC., Boise, ID (US)

(72) Inventors: Laura Varisco, San Jose, CA (US); Swetha Bongu, Santa Clara, CA (US); Kirthi Ravindra Kulkarni, San Jose, CA (US); Soujanya Venigalla, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/751,453

(22) Filed: May 23, 2022

(65) Prior Publication Data
US 2022/0293181 A1 Sep. 15, 2022

Related U.S. Application Data

(62) Division of application No. 17/020,704, filed on Sep. 14, 2020, now Pat. No. 11,342,024.

(60) Provisional application No. 62/955,911, filed on Dec. 31, 2019.

(51) Int. Cl.
G11C 16/08 (2006.01)
G11C 16/16 (2006.01)
G11C 16/20 (2006.01)
G11C 16/26 (2006.01)

(52) U.S. Cl.
CPC ............. *G11C 16/08* (2013.01); *G11C 16/16* (2013.01); *G11C 16/20* (2013.01); *G11C 16/26* (2013.01)

(58) Field of Classification Search
CPC ......... G11C 16/08; G11C 16/16; G11C 16/20; G11C 16/26
USPC ..................................................... 365/230.06
See application file for complete search history.

(56) References Cited

U.S. PATENT DOCUMENTS

| | | |
|---|---|---|
| 2017/0139641 A1 | 5/2017 | Cha et al. |
| 2017/0287547 A1* | 10/2017 | Ito .......................... G11C 29/783 |
| 2018/0218767 A1* | 8/2018 | Wolff ..................... G11C 11/408 |
| 2019/0096487 A1* | 3/2019 | Nishikawa ............ G06F 3/0679 |
| 2019/0243708 A1 | 8/2019 | Cha et al. |
| 2019/0371391 A1 | 12/2019 | Cha et al. |
| 2019/0371419 A1 | 12/2019 | Ema et al. |
| 2020/0349995 A1 | 11/2020 | Shore et al. |

FOREIGN PATENT DOCUMENTS

JP 2016212934 A 12/2016

\* cited by examiner

*Primary Examiner* — Ly D Pham
(74) *Attorney, Agent, or Firm* — Lowenstein Sandler LLP

(57) ABSTRACT

A system includes a memory device and a processing device coupled to the memory device. The processing device is to perform operations including maintaining a counter to track a number of memory access operations performed on a range of consecutive wordlines in a block of the memory device. The operations further include determining that the number of memory access operations performed on the range of consecutive wordlines satisfies a threshold criterion. The operations further include, responsive to the number of memory access operations performed on the range of consecutive wordlines satisfying the threshold criterion, causing a memory management operation to be performed at each wordline of the range of consecutive wordlines in the block of the memory device.

20 Claims, 6 Drawing Sheets

| INITIAL ADDRESS 410 | WORDLINE DISTANCE 420 | OPERATION COUNTER 430 |
|---|---|---|
| 5 | 0 | 1 |
| | | |

| INITIAL ADDRESS 410 | WORDLINE DISTANCE 420 | OPERATION COUNTER 430 |
|---|---|---|
| 5 | 0 | 1 |
| 10 | 0 | 1 |

| INITIAL ADDRESS 410 | WORDLINE DISTANCE 420 | OPERATION COUNTER 430 |
|---|---|---|
| 5 | 2 | 2 |
| 10 | 0 | 1 |

| | INITIAL ADDRESS 410 | MAX. WORDLINE DISTANCE 420 | OPERATION COUNTER 430 | |
|---|---|---|---|---|
| 440 → | 5 | 4 | 1000 | ← |
| 450 → | 10 | 2 | 500 | |

| | INITIAL ADDRESS 410 | MAX. WORDLINE DISTANCE 420 | OPERATION COUNTER 430 | |
|---|---|---|---|---|
| 440 → | 5 | 4 | 1000 | |
| 450 → | 10 | 2 | 1000 | ← |

FIG. 4E

TRACKING OPERATIONS PERFORMED AT A MEMORY DEVICE

RELATED APPLICATIONS

This application is a divisional application of U.S. application Ser. No. 17/020,704, filed Sep. 14, 2020, which claims the benefit of U.S. Provisional Application No. 62/955,911, filed Dec. 31, 2019, the entire contents of which are hereby incorporated by reference herein.

TECHNICAL FIELD

Embodiments of the disclosure relate generally to memory sub-systems, and more specifically, relate to tracking operations performed at a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 4A-4E illustrate an example data structure for tracking operations performed at a memory device, in accordance with some embodiments of the present disclosure.

DETAILED DESCRIPTION

Figure 1:
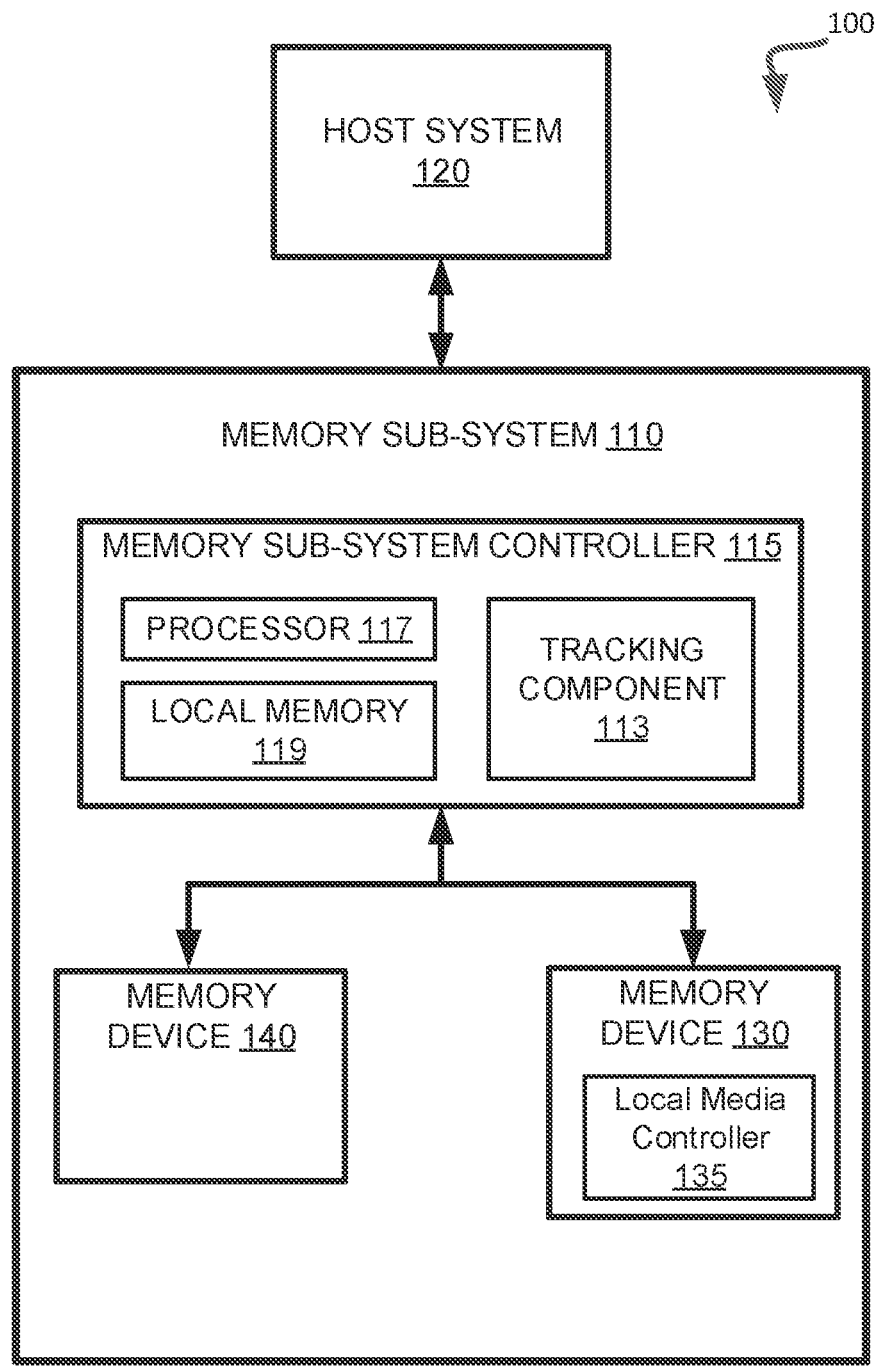
FIG. 1 illustrates an example computing system that includes a memory sub-system, in accordance with some embodiments of the present disclosure.

Aspects of the present disclosure are directed to tracking operations performed at a memory device. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device in a memory sub-system can include memory cells that can include one or more memory pages for storing one or more bits of binary data corresponding to data received from the host system. One or more memory cells of the memory device can be grouped together to form a block. The memory cells of a block can be arranged along a number of separate wordlines. When data is written to a memory cell of the memory device for storage, a voltage is applied to the wordline on which the memory cell is located. In some instances, this can cause the memory cells on the wordline to deteriorate. Accordingly, the memory cells of each wordline of the memory device can handle a finite number of write operations performed before the memory cells are no longer able to reliably store data.

Data stored at the memory cells of the memory device can be read from the memory component and transmitted to the host system. When data is read from a memory cell on a given wordline of the memory device, the memory cells on nearby or adjacent wordlines can experience what is known as read disturb. Read disturb is a result of continually reading from memory cells on one wordline without intervening memory management operations, such as erase and/or refresh operations, causing other memory cells on other nearby wordlines to change over time (e.g., become programmed). If too many read operations are performed on the memory cells of a given wordline, data stored at memory cells of adjacent wordlines of the memory device can be corrupted or incorrectly stored at the memory cell. This can result in a higher error rate of the data stored at the memory cells and can increase the use of an error detection and correction operations (e.g., an error control operation) for subsequent operations (e.g., read and/or write) performed on the memory cells. The increased use of error control operations can result in a reduction of the performance of a conventional memory sub-system. In addition, as the error rate from a memory cell or block continues to increase, it may surpass the error correction capabilities of the memory sub-system, which can lead to an irreparable loss of data. Furthermore, as more resources of the memory sub-system are used to perform the error control operation, fewer resources can be used to perform other read operations or write operations.

Conventionally, a memory controller of the memory device can periodically cause a refresh operation to be performed at wordlines of a block that are frequently accessed during operation of the memory sub-system in order to prevent corruption or incorrect storage of data at memory cells of the wordline. In existing systems, the memory controller typically maintains a data structure to keep track of each instance that a wordline of each block in a memory device is accessed during operation of the memory sub-system. The memory controller causes a refresh operation to be performed once the number of instances that a wordline is accessed exceeds a particular number of instances. As the blocks of each memory device can include a significant number of wordlines (e.g., millions), the data structure can similarly include a significant number of entries (i.e., an entry for each wordline). As such, the memory controller can use significant memory resources in order to maintain the data structure.

Aspects of the present disclosure address the above and other deficiencies by providing a technique that reduces the size of a data structure used to track memory access operations (e.g., read operations, write operations, erase operations, etc.) performed at a memory device and minimizes a number of memory management operations, such as refresh operations, performed to address read disturb. A controller at a memory sub-system can maintain a data structure for tracking memory access operations performed at wordlines of each block of a memory device of the memory sub-system. In some embodiments, the controller can be a memory sub-system controller. In other or similar embodiments, the controller can be a local media controller. The data structure can include multiple entries, where each entry corresponds to a range of consecutive wordlines in a block of a memory device. Each entry of the data structure can include a counter to track a number of operations performed on any wordline of the corresponding range of consecutive wordlines in the block. In some embodiments, the counter can track a number of instances that a particular type of operation is performed on any wordline in the range of consecutive wordlines, such as a read operation. In an illustrative example, a range of consecutive wordlines can include wordline 2 through wordline 7 in a block, where an entry of the data structure corresponds each of the range of consecutive wordlines. In each instance that a memory access operation, such as a read operation, is performed at any wordline included in the range of the consecutive wordlines, a counter included in the entry is updated.

The controller can update or create one or more entries of the data structure in response to receiving an indication of an operation pertaining to a particular wordline. For example, in response to receiving an indication of an operation pertaining to a particular wordline, the controller can determine whether the particular wordline is within any range of consecutive wordlines that corresponds to an entry in the data structure. Responsive to determining the particular wordline is within a range of consecutive wordlines that corresponds to an entry in the data structure, the controller can update a counter of the corresponding entry to account for the operation pertaining to the particular wordline. In response to determining the particular wordline is outside of any range of consecutive wordlines that corresponds to an entry in the data structure, the controller can create a new entry for a new range of consecutive wordlines that includes the particular wordline.

Each entry of the data structure can further include a value indicating a distance between an address of an original wordline that prompted creation of an entry at the data structure (referred to as an initial address) and an address of a subsequently-accessed wordline within the range of consecutive wordlines. In some embodiments, the controller does not update the distance value in the entry unless a distance between the address of the original wordline and the address of the subsequently accessed wordline exceeds a current distance value associated with the entry. In some embodiments, a distance value associated with the entry cannot exceed a threshold distance value that defines a maximum size of the range of consecutive wordlines. In such embodiments, in response to determining that the distance value between the address of the initial wordline and the address of the subsequent wordline exceeds the threshold, the controller can determine that the subsequent wordline falls outside of the range. If no other entry in the data structure corresponds to a range that can cover the subsequent wordline, the controller can create a new entry to represent a new range that covers the subsequent wordline.

The controller can monitor counters associated with respective entries of the data structure. The controller can cause a memory management operation to be performed at each wordline of the range of consecutive wordlines in the block of the memory device in response to determining, in view of a value of the counter satisfying (e.g., meeting or exceeding) a threshold criterion. In some embodiments, the controller can cause the memory management operation to be performed at wordlines outside of the range of consecutive wordlines. For example, the controller can cause a memory management operation to be performed at a wordline adjacent to a wordline having the lowest address in the range of consecutive wordlines and/or a memory management operation to be performed at a wordline adjacent to a wordline having the highest address in the range of consecutive wordlines. In response to the controller causing the memory management operation to be performed at each wordline of the range of consecutive wordlines, the controller can remove the entry corresponding to the range of consecutive wordlines from the data structure.

Advantages of the present disclosure include, but are not limited to, a decrease in the error rate of data stored at memory cells and a decrease in the use of error detection and correction operations. As the data structure is used to keep track of a number of operations performed on a range of wordlines, wordlines that are frequently accessed and wordlines that are adjacent to frequently accessed wordlines can more easily be identified and a memory management operation can be performed in order to prevent memory cells of the frequently accessed wordlines to become corrupted, thus decreasing the error rate of data stored at the memory cells. As the error rate of data stored at the memory cells is decreased, a decrease in the use of error detection and correction operations results. Further, as each entry of the data structure corresponds to a range of consecutive wordlines in a block, rather than a single wordline, significantly less memory resources are used during operation of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device which includes one or more processors (e.g., processor 117) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a tracking component 113 that can track operations performed at a memory device 130, 140 of sub-system 110. Tracking component 113 can maintain a data structure including one or more entries, where each entry corresponds to a range of consecutive wordlines in a block of a memory device, such as memory device 130. Each entry can include a counter to track a number of operations performed on any wordline of the range of consecutive wordlines in the block of memory device 130. In some embodiments, the counter can track a number of particular operations that are performed on any wordline of the range of consecutive wordlines, such as a read operation. In response to determining that the number of operations performed on the range of consecutive wordlines satisfies a threshold criterion (e.g., by reaching a threshold value), tracking component 113 can cause a memory management operation to be performed at each wordline of the range of consecutive wordlines in the block.

Tracking component 113 can update or create one or more entries of the data structure in response to receiving an indication of an operation pertaining to a particular wordline. For example, in response to receiving an indication of an operation pertaining to a particular wordline, tracking component 113 can determine whether the particular wordline is within any range of consecutive wordlines that has a corresponding entry in the data structure. Responsive to determining the particular wordline is within a range of consecutive wordlines that has a corresponding entry in the data structure, tracking component 113 can update a counter of the entry to account for the operation pertaining to the particular wordline (e.g., increase a value of the counter by one). In response to determining the particular wordline is outside of any range of consecutive wordlines that has a corresponding entry in the data structure, tracking component 113 can create a new entry for a new range of consecutive wordlines that includes the particular wordline.

Figure 2:
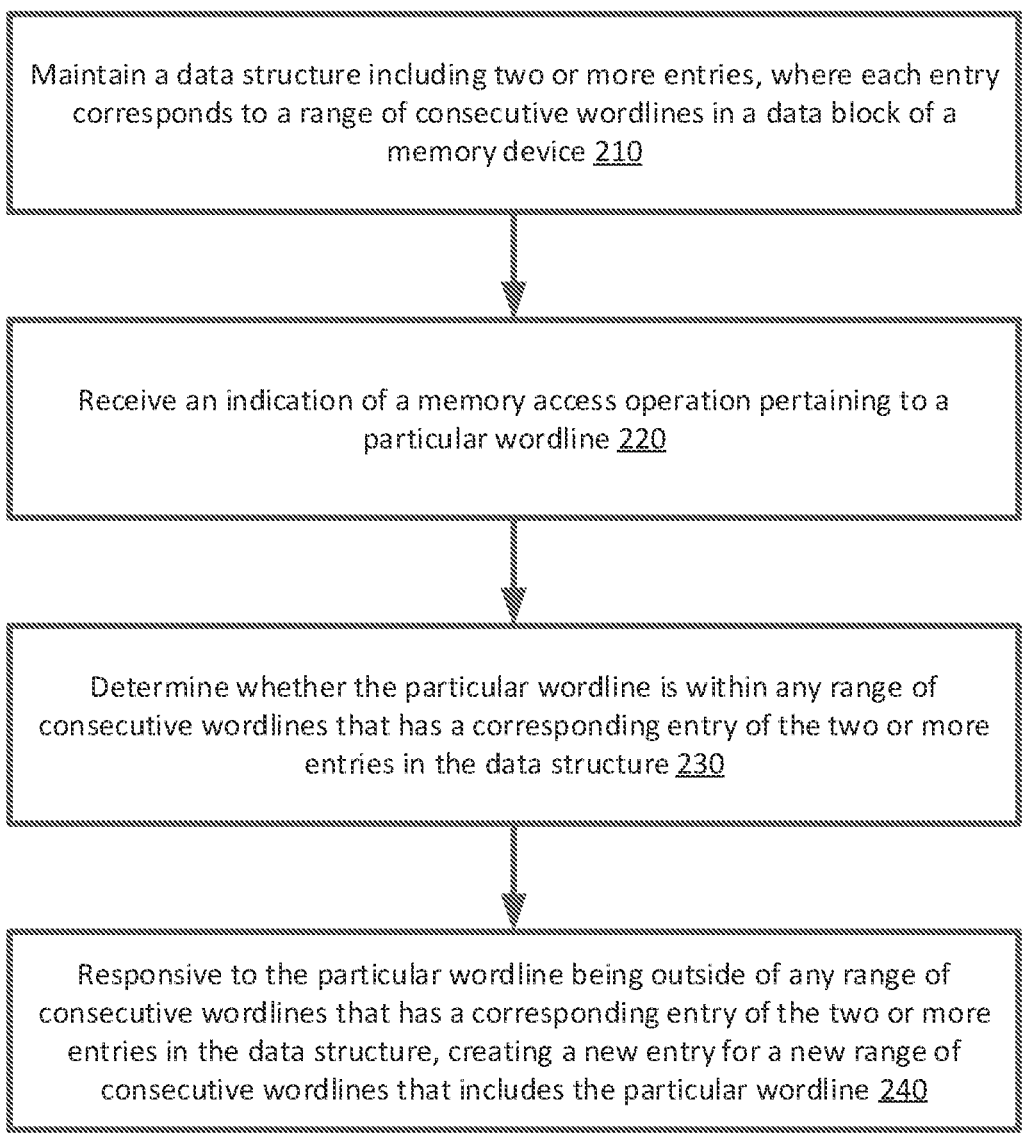
FIG. 2 is a flow diagram of an example method to maintain a data structure for tracking operations performed at a memory device, in accordance with some embodiments of the present disclosure.

Each entry of the data structure can further include a value indicating a distance between an address of a wordline that prompted creation of an entry at the data structure (referred to as an initial address) and an address of a subsequently-accessed wordline within the range of consecutive wordlines. In some embodiments, tracking component 113 does not update the distance value in the entry unless a distance between the address of the original wordline and the address of the subsequently accessed wordline exceeds the current distance value associated with the entry. In some embodiments, a distance value associated with the entry cannot exceed a threshold that defines the maximum size of the range. In such embodiments, if tracking component 113 determines that the distance value between the address of the initial wordline and the address of the subsequent wordline exceeds the threshold, it indicates that the subsequent wordline falls outside of the range, and if no other entry in the data structure corresponds to a range that can cover the subsequent wordline, then tracking component 113 creates a new entry to represent a new range that covers the subsequent wordline FIG. 2 is a flow diagram of an example method 200 of maintaining a data structure for tracking operations performed at a memory device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, one or more operations of method 200 is performed by memory sub-system controller 115 of memory sub-system 110 of FIG. 1. In other or similar embodiments, one or more operations of method 200 is performed by local media controller 135 of a memory device 130, 140 of memory sub-system 110. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic maintains a data structure including two or more entries, where each entry corresponds to a range of consecutive wordlines in a block of a memory device, such as memory device 130, 140 of FIG. 1. Each range of consecutive wordlines for an entry can include an initiating wordline that prompts a creation of the entry in the data structure. Further details regarding some aspects of the initiating wordline are provided with respect to FIGS. 4A-4E. Each entry can include an operation counter to track a number of memory access operations (e.g., read operations, write operations, erase operations, etc.) performed on the range of consecutive wordlines in the block of the memory device 134, 140. Further details regarding some aspects of the data structure are provided with respect to FIGS. 4A-4E.

At operation 220, the processing logic receives an indication of a memory access operation pertaining to a particular wordline. In some embodiments, the processing logic can receive the indication in response to a host system, such as host system 120, transmitting a request to access a wordline of memory device 130, 140. At operation 230, the processing logic determines whether the particular wordline is within any range of consecutive wordlines that has a corresponding entry in the data structure. In some embodiments, the processing logic determines whether the particular wordline is within any range of consecutive wordlines that has a corresponding entry in the data structure by determining that a difference between a first memory address for the particular wordline and a second memory address for the initiating wordline does not satisfy a difference criterion, in accordance with previously described embodiments.

At operation 240, the processing logic creates a new entry for a new range of consecutive wordlines that includes the particular wordline in response to the particular wordline being outside of any range of consecutive wordlines that has a corresponding entry in the data structure. In response to determining the particular wordline is within a range of consecutive wordlines that has the corresponding entry of the data structure, the processing logic can update a value of the operation counter of the corresponding entry based on the indication of the memory access operation (e.g., increase the value of the operation counter by 1).

In some embodiments, the processing logic can determine that a number of entries of the data structure exceeds a threshold criterion. The processing logic can identify a particular entry to be removed from the data structure and perform a memory management operation (e.g., a memory refresh operation) for each of the range of consecutive wordlines corresponding to the identified entry. In some embodiments, the processing logic can identify the particular entry to be removed by determining that a value of the operation counter for the particular entry is larger than a value for each operation counter for the remaining entries of the data structure. Further details regarding some aspects of removing an entry from the data structure are provided with respect to FIGS. 4A-4E.

In some embodiments, the processing logic can perform the memory management operation for one or more additional wordlines outside of the range of consecutive wordlines corresponding to the particular entry. For example, the processing logic can cause the memory management operation to be performed at a wordline having a memory address that is adjacent to a wordline having a smallest memory address of the range of consecutive wordlines and/or a wordline having a largest memory address of the range of consecutive wordlines. In such embodiments, the processing logic can remove the entry from the data structure in response to causing the memory management operation to be performed for each wordline of the range of consecutive wordlines as well as the additional wordlines.

Figure 3:
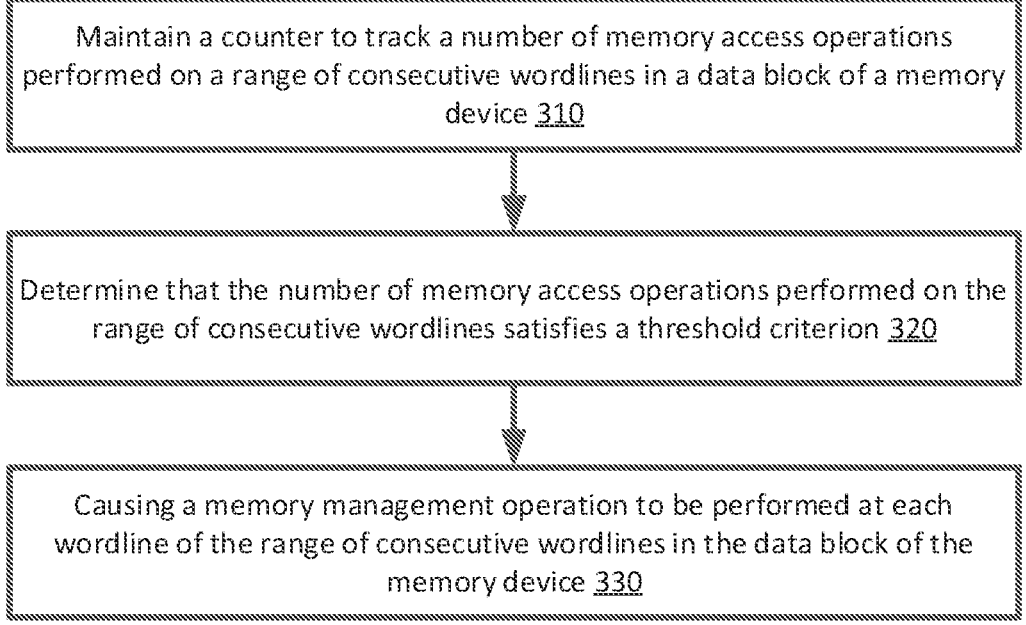
FIG. 3 is a flow diagram of an example method to cause a memory management operation to be performed at select wordlines of a block, in accordance with some embodiments of the present disclosure.

FIG. 3 is a flow diagram of an example method 300 for causing a memory management operation to be performed at select wordlines of a block, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, one or more operations of method 300 is performed by memory sub-system controller 115 of memory sub-system 110 of FIG. 1. In other or similar embodiments, one or more operations of method 300 is performed by local media controller 135 of a memory device 130, 140 of memory sub-system 110. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic maintains a counter to track a number of memory access operations performed on a range of consecutive wordlines in a block of a memory device, such as memory device 130, 140 of FIG. 1. The counter can be a counter included in an entry of a data structure, in accordance with previously described embodiments. In some embodiments, the processing logic can receive an indication of a memory access operation (e.g., a read operation, a write operation, an erase operation, etc.) pertaining to a particular wordline of the range of consecutive wordlines. The processing logic can maintain the counter to track the memory access operation by increasing the value of the counter based on the received indication (i.e., increasing the value by 1).

At operation 320, the processing logic determines that the number of memory access operations performed on the range of consecutive wordlines satisfies a threshold criterion. In some embodiments, the processing logic determines that the number of memory access operations performed on the range of consecutive wordlines satisfies the threshold criterion by determining that the value of the counter exceeds a threshold value. In some embodiments, the threshold value can be defined prior to initialization of the memory sub-system. For example, threshold value can be defined by a programmer or an operator of tracking component 113 prior to initialization of the memory sub-system.

At operation 330, the processing logic causes a memory management operation (e.g., a memory refresh operation) to be performed at each wordline of the range of wordlines in the block of the memory device. In some embodiments, the processing logic can cause the memory management operation to be performed at one or more additional wordlines outside of the range of consecutive wordlines in the block of memory device 130, 140. For example, the processing logic can cause the memory management operation to be performed at a wordline having a memory address that is adjacent to a wordline having the smallest memory address of the range of consecutive wordlines and/or a wordline having the largest memory address of the range of consecutive wordlines. In such embodiments, the processing logic can remove the entry from the data structure in response to causing the memory management operation to be performed for each wordline of the range of consecutive wordlines as well as the additional wordlines. In some embodiments, in response to causing the memory management operation to be performed at each wordline of the range of consecutive wordlines, the processing logic can set a value of the counter to an initial value (e.g., to zero). As described previously, in some embodiments, the counter can be a counter of a data structure. In such embodiments, the processing logic can determine to remove an entry including the counter upon setting the value of the counter to the initial value.

FIGS. 4A-4E illustrate an example data structure 400 for tracking operations performed at a memory device, in accordance with some embodiments of the present disclosure. In some embodiments, data structure 400 can include the data structure maintained by tracking component 113 described with respect to FIG. 1. In other or similar embodiments, data structure 400 can be maintained by local media controller 135.

Data structure 400 can include one or more entries, where each entry corresponds to a range of consecutive wordlines in a block of a memory device, such as memory device 130. Each entry can include an address of a wordline accessed during an initial operation performed at the range of consecutive wordlines in the block, such as initial address 410. In some embodiments, initial address 410 can correspond to the address of the wordline pertaining to an operation performed at the block that prompted a creation of the entry of data structure 410.

FIG. 4A illustrates data structure 400 updated in response to tracking component 113 receiving an indication of an operation pertaining to a particular wordline of a block of a memory device. In an illustrative example, the operation pertains to wordline 5 of a block. Prior to receiving the indication of the operation pertaining to wordline 5, no entries are included in data structure 400. In response to receiving the first indication of the operation pertaining to wordline 5, tracking component 113 can determine whether wordline 5 is within any range of consecutive wordlines that has a corresponding entry of data structure 400. As no entries are included in data structure 400 prior to tracking component 113 receiving the indication of the operation pertaining to wordline 5, tracking component 113 can determine that wordline 5 is not within any range of consecutive wordlines that has a corresponding entry in data structure 400. As such, tracking component 113 can create a new entry (i.e., first entry 440) for a new range of consecutive wordlines that include wordline 5. The initial address 410 of first entry 440 can be set to reference wordline 5, as wordline 5 is an address of the wordline pertaining to an operation performed at the block that prompted the creation of the first entry 440.

As discussed previously, each entry of data structure 400 can correspond to a range of consecutive wordlines of a block of the memory device. In some embodiments, the range of consecutive wordlines can be determined based on the initial address 410 included in the corresponding entry and a distance threshold. In some embodiments, the distance threshold can be defined prior to initiation of one or more operations at the memory device. For example, the distance threshold can be defined by a developer or programmer of tracking component 113 prior to initialization of the memory device. The distance threshold can define the size of the range and can correspond to a maximum distance between the initial address 410 of the initial wordline in an entry of data structure 400 and an address of another wordline covered by the entry. For example, the distance threshold can be defined to be a value of 4. As such, a first range of consecutive wordlines can be determined, based on the initial address 410 of first entry 440, to be wordline 1 through wordline 9 (i.e., four wordlines of the block before wordline 5 and four wordlines of the block after wordline 5).

In response to receiving an indication of an operation pertaining to a particular wordline of the block, tracking component 113 can determine whether the particular wordline is within any range of consecutive wordlines that has a corresponding entry of data structure 400. In response to determining the particular wordline is within a range of consecutive wordlines that has a corresponding entry of data structure 400, tracking component 113 can update the corresponding entry of data structure 400 in accordance with embodiments described herein. In response to determining the particular wordline is not within any range of consecutive wordlines that has a corresponding entry of data structure 400, tracking component 113 can create a new entry for a new range of consecutive wordlines that includes a particular wordline. In accordance with the previous example, tracking component 113 can receive an indication of an operation pertaining to wordline 10 of the block. Wordline 10 is not included in the range of wordlines corresponding to first entry 440 (i.e., wordline 10 is outside of the range of wordline 1 through wordline 9). As such, tracking component 113 can create a new entry for a new range of consecutive wordlines that includes wordline 10, such as the second entry 450 of data structure 400, as illustrate with respect to FIG. 4B. As the distance threshold is set to be a value of 4, a second range of consecutive wordlines can be determined, based on the initial address 410 of second entry 450, to be wordline 6 through wordline 14 (i.e., four wordlines of the block before wordline 10 and four wordlines of the block after wordline 10).

Each entry of data structure 400 can further include a counter for tracking a number of operations pertaining to a range of consecutive wordlines in a block. Tracking component 113 can update the counter for an entry each time an indication of an operation pertaining to a wordline of the range of consecutive wordlines is received. For example, in response to creating first entry 440 and second entry 450, tracking component can update the counter for each entry to 1, respectively.

Each entry of data structure 400 can further include a value of a wordline distance 420. The value of the wordline distance 420 can indicate a distance between the initial address 410 of the entry and an address of a subsequent operation pertaining to a wordline of a block of the memory device (referred to as a subsequent address). The distance between the initial address 410 and a subsequent address cannot exceed the distance threshold. In some embodiments, the value of the wordline distance 420 can be set to zero in response to an entry being created for data structure 400. For example, the value of the wordline distance 420 can be set to zero for first entry 440 and second entry 450 in response to tracking component 113 creating first entry 440 and second entry 450.

Tracking component 113 can change the value of the wordline distance 420 in response to receiving an indication of a subsequent operation pertaining to a particular wordline of a block, where the particular wordline is within the range of consecutive wordlines corresponding to an entry of data structure 400. In some embodiments, tracking component 113 can change the value of the wordline distance 420 of an entry in response to determining a distance between the initial address 410 and the address of wordline pertaining to the subsequent operation exceeds the currently stored value of the wordline distance 420 in the entry.

Referring to FIG. 4C, in an illustrative example, tracking component 113 can receive an indication of an operation pertaining to wordline 7. Tracking component 113 can determine that wordline 7 is included in the first range of consecutive wordlines corresponding to first entry 440 (e.g., wordline 7 is within the range of wordline 1 through wordline 9) and in the second range of consecutive wordlines corresponding to the second entry 450 (e.g., wordline 7 is within the range of wordline 6 through wordline 14). In some embodiments, tracking component 113 can associate the indication of the operation pertaining to wordline 7 with an entry that was included in the data structure earlier than other entries. For example, in response to determining that wordline 7 is included in the first range of consecutive wordlines corresponding to the first entry 440 and the second entry 450, tracking component 113 can associate the indication of the operation pertaining to wordline 7 with the first entry 440, as the first entry 440 was included in the data structure earlier than the second entry 450. In other or similar embodiments, tracking component 113 can associate the indication of the operation pertaining to wordline 7 with an entry where a difference between the address for wordline 7 and an initial address 410 for the entry is smaller than a difference between the address for wordline 7 and an initial address 410 for other entries. For example, a difference between the address for wordline 7 and the initial address 410 for entry 440 (i.e., the address for wordline 5) is two wordlines. The difference between the address for wordline 7 and the initial address 410 for entry 450 (i.e., the address for wordline 10) is three wordlines. As a difference of two wordlines is smaller than a difference of three wordlines, tracking component 113 can associate the indication of the operation for wordline 7 with entry 440. In other or similar embodiments, tracking component 113 can associate the indication of the operation for wordline 7 with each entry of data structure 400 that corresponds to a range of consecutive wordlines including wordline 7 (i.e., the first entry 440 and the second entry 450).

In response to determining that wordline 7 is included in the first range of consecutive wordlines corresponding to first entry 440 and the indication of the operation for wordline 7 is to be associated with the first entry 440, tracking component 113 can determine whether the distance between the initial address 410 of wordline 5 and the subsequent address of wordline 7 (i.e., the distance of 2) exceeds the value of the currently stored wordline distance in the entry (i.e., the value of 0). In response to determining the distance between the initial address 410 of wordline 5 and the subsequent address of wordline 7 exceeds the currently stored value of the wordline distance 420, tracking component 113 can change the value of the wordline distance 420 for first entry 440 to 2 (i.e., there is a distance of two wordlines between the initial address 410 of 5 and the subsequent address of 7). Further, tracking component 113 can update the counter to account for the indication of the operation pertaining to wordline 7 (i.e., update the counter to the value of 2).

In a further example, tracking component 113 can receive an indication of an operation pertaining to wordline 6. In response to determining that wordline 6 is included in the first range of consecutive wordlines corresponding to first entry 440 and that the indication of the operation for wordline 6 is to be associated with first entry 440, tracking component 113 component can determine whether the distance between initial address 410 of wordline 5 and the subsequent address of wordline 6 (i.e., the distance of 1) exceeds the currently stored value of the wordline distance 420 (i.e., the value of 2). In response to determining the distance between the initial address 410 of wordline 5 and the subsequent address of wordline 6 does not exceed the currently stored value of the wordline distance 420, tracking component 113 does not update the value of wordline distance 420 of first entry 440. Tracking component 113 does update the operation counter 430 of first entry 440 to account for the operation pertaining to wordline 6.

In some embodiments, tracking component 113 can determine an operation counter 430 of an entry satisfies a threshold criterion. The threshold criterion can correspond to a number of operations performed at any wordline of the range of consecutive wordlines in an entry that triggers a memory management operation. In some embodiments, the threshold criterion can be defined prior to operation of the memory device of the memory sub-system. In response to determining an operation counter 430 of an entry satisfies the threshold criterion, tracking component 113 can cause a memory management operation to be performed at each wordline of the range of consecutive wordlines in the block of the memory device. In some embodiments, tracking component 113 can cause the memory management operation to be performed at wordlines outside of the range of consecutive wordlines in the block. For example, tracking component 113 can cause the memory management operation to be performed at one or more wordlines of the block that are adjacent to a wordline having the lowest address in the range of consecutive wordlines and/or one or more wordlines of the block that are adjacent to a wordline having the highest address in the range of consecutive wordlines. In an illustrative example, in response to tracking component 113 determining the operation counter 430 of second entry 450 satisfies the threshold criterion, tracking component 113 can cause a memory management operation to be performed at each wordline of the second range of consecutive wordlines (i.e., at wordline 6 through wordline 14). Tracking component 113 can further cause a memory management operation to be performed at a wordline that is adjacent to a wordline with the lowest address (e.g., wordline 5) and/or a wordline of the block that is adjacent to a wordline with the highest address (e.g., wordline 15).

In response to causing the memory management operation to be performed at each wordline of the range of consecutive wordlines corresponding to an entry of data structure 400, tracking component 113 can cause the corresponding entry to be removed from data structure 400.

Referring now to FIG. 4D, as tracking component 113 continues to create entries in data structure 400, the number of created entries can satisfy a data structure entry criterion. In some embodiments, the number of created entries can satisfy the data structure entry criterion in response to exceeding a data structure entry threshold. The data structure entry threshold can correspond to a maximum number of entries to be included in data structure 400.

In response to determining the number of entries of data structure 400 exceeds the data structure entry threshold, tracking component 113 can identify an existing entry that should be removed from data structure 400, to cause the number of entries of data structure 400 to satisfy (i.e., meet or fall below) the data structure entry threshold. In some embodiments, tracking component 113 can identify an entry of data structure 400 with a highest value of the operation counter 430. As illustrated in FIG. 4D, first entry 440 can be identified by tracking component 113 because the operation counter 430 is 1000, which is higher than the operation counter 430 of second entry 450. In response to identifying the entry of data structure 400 with the highest value of the operation counter 430, tracking component 113 can cause a memory management operation to be performed at each wordline of the range of consecutive wordlines corresponding to first entry 440, in accordance with previous embodiments. Once the memory management operation is initiated for the range of consecutive wordlines, tracking component 113 can remove first entry 440 from data structure 400.

Referring now to FIG. 4E, in some embodiments, tracking component 113 can identify two or more entries of data structure 400 that have the same (highest compared to other entries) value of the operation counter 430. For example, as illustrated in FIG. 4E, the value of the operation counter 430 of the first entry 440 is 1000, which is the same as the value of the operation counter 430 of the second entry 450. In such embodiments, tracking component 113 can identify the entry, of the two or more entries, that has the lower value for the stored wordline distance 420. For example, tracking component 113 can identify second entry 450 with the value of the wordline distance 420 that is lower than the value of the wordline distance 420 for first entry 440. In response to identifying the entry with the lower value for the wordline distance 420, tracking component 113 can cause a memory management operation to be performed at each wordline of the range of consecutive wordlines corresponding with the entry, in accordance with previously disclosed embodiments. In response to causing the memory management operation to be performed at each wordline of the range of consecutive wordlines, tracking component 113 can remove the entry from data structure 400.

Figure 5:
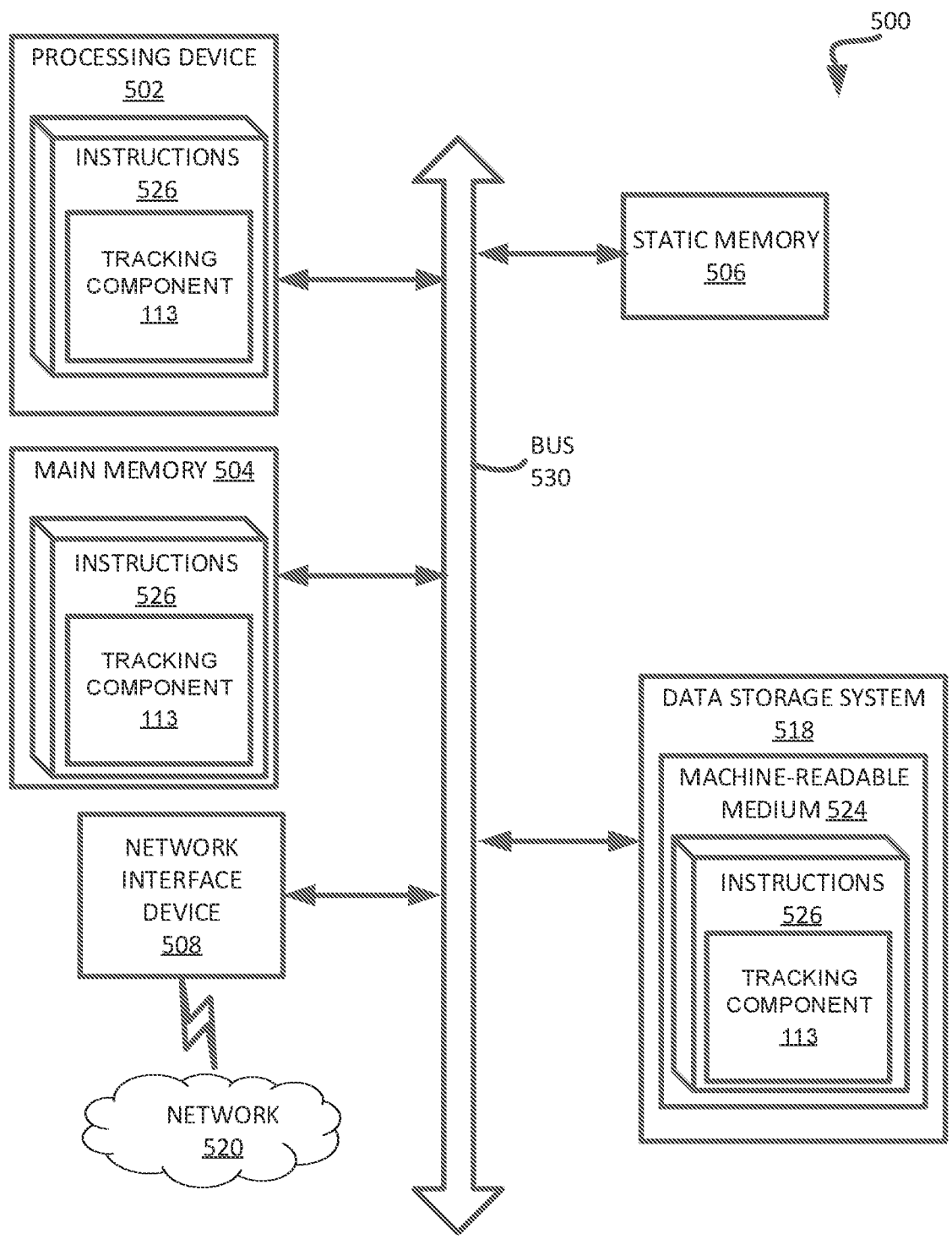
FIG. 5 is a block diagram of an example computer system, in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the tracking component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a tracking component (e.g., the tracking component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device coupled to the memory device, wherein the processing device is configured to:
maintain a counter to track a number of memory access operations performed on a range of consecutive wordlines in a block of the memory device;
determine that the number of memory access operations performed on the range of consecutive wordlines satisfies a threshold criterion; and
responsive to the number of memory access operations performed on the range of consecutive wordlines satisfying the threshold criterion, cause a memory management operation to be performed at each wordline of the range of consecutive wordlines in the block of the memory device.

2. The system of claim 1, wherein to determine that the number of memory access operations performed on the range of consecutive wordlines satisfies the threshold criterion, the processing device is to:
determine that a value of the counter to track the number of memory access operations exceeds a threshold value.

3. The system of claim 1, wherein the processing device is further configured to:
cause the memory management operation to be performed at one or more additional wordlines outside of the range of consecutive wordlines in the block of the memory device.

4. The system of claim 1, wherein the processing device is further configured to:
responsive to causing the memory management operation to be performed at each wordline of the range of consecutive wordlines in the block of the memory device, set a value of the counter to an initial value.

5. The system of claim 1, wherein to maintain the counter to track the number of memory access operations performed on a range of consecutive wordlines in the block of the memory device, the processing device is to:

receive an indication of a memory access operation pertaining to a particular wordline of the range of consecutive wordlines; and
increase a value of the counter based on the received indication.

6. The system of claim 1, wherein the memory access operations comprise at least one of a read operation, a write operation, or an erase operation.

7. The system of claim 1, wherein the memory management operation comprises a memory refresh operation.

8. A method comprising:
maintaining a counter to track a number of memory access operations performed on a range of consecutive wordlines in a block of a memory device;
determining that the number of memory access operations performed on the range of consecutive wordlines satisfies a threshold criterion; and
responsive to the number of memory access operations performed on the range of consecutive wordlines satisfying the threshold criterion, causing a memory management operation to be performed at each wordline of the range of consecutive wordlines in the block of the memory device.

9. The method of claim 8, wherein determining that the number of memory access operations performed on the range of consecutive wordlines satisfies the threshold criterion comprises:
determining that a value of the counter to track the number of memory access operations exceeds a threshold value.

10. The method of claim 8, further comprising:
causing the memory management operation to be performed at one or more additional wordlines outside of the range of consecutive wordlines in the block of the memory device.

11. The method of claim 8, further comprising:
responsive to causing the memory management operation to be performed at each wordline of the range of consecutive wordlines in the block of the memory device, setting a value of the counter to an initial value.

12. The method of claim 11, wherein maintaining the counter to track the number of memory access operations performed on a range of consecutive wordlines in the block of the memory device comprises:
receiving an indication of a memory access operation pertaining to a particular wordline of the range of consecutive wordlines; and
increasing a value of the counter based on the received indication.

13. The method of claim 8, wherein the memory access operations comprise at least one of a read operation, a write operation, or an erase operation.

14. A non-transitory computer-readable storage medium comprising instructions that, when executed by a processing device, cause the processing device to perform operations comprising:
maintaining a counter to track a number of memory access operations performed on a range of consecutive wordlines in a block of a memory device;
determining that the number of memory access operations performed on the range of consecutive wordlines satisfies a threshold criterion; and
responsive to the number of memory access operations performed on the range of consecutive wordlines satisfying the threshold criterion, causing a memory management operation to be performed at each wordline of the range of consecutive wordlines in the block of the memory device.

15. The non-transitory computer-readable storage medium of claim 14, wherein determining that the number of memory access operations performed on the range of consecutive wordlines satisfies the threshold criterion comprises:
   determining that a value of the counter to track the number of memory access operations exceeds a threshold value.

16. The non-transitory computer-readable storage medium of claim 14, wherein the operations further comprise:
   causing the memory management operation to be performed at one or more additional wordlines outside of the range of consecutive wordlines in the block of the memory device.

17. The non-transitory computer-readable storage medium of claim 14, wherein the operations further comprise:
   responsive to causing the memory management operation to be performed at each wordline of the range of consecutive wordlines in the block of the memory device, setting a value of the counter to an initial value.

18. The non-transitory computer-readable storage medium of claim 17, wherein maintaining the counter to track the number of memory access operations performed on a range of consecutive wordlines in the block of the memory device comprises:
   receiving an indication of a memory access operation pertaining to a particular wordline of the range of consecutive wordlines; and
   increasing a value of the counter based on the received indication.

19. The non-transitory computer-readable storage medium of claim 14, wherein the memory access operations comprise at least one of a read operation, a write operation, or an erase operation.

20. The non-transitory computer-readable storage medium of claim 14, wherein the memory management operation comprises a memory refresh operation.

* * * * *